(12) United States Patent
Fischer et al.

(10) Patent No.: US 6,592,840 B1
(45) Date of Patent: Jul. 15, 2003

(54) HIGHLY PURE AQUEOUS HYDROGEN PEROXIDE SOLUTIONS, METHOD FOR PRODUCING SAME AND THEIR USE

(75) Inventors: Martin Fischer, Ludwigshafen (DE); Achim Stammer, Freinsheim (DE); Stefan Quaiser, Limburgerhof (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 0 days.

(21) Appl. No.: 09/673,247

(22) PCT Filed: Apr. 19, 1999

(86) PCT No.: PCT/EP99/02627
§ 371 (c)(1),
(2), (4) Date: Oct. 23, 2000

(87) PCT Pub. No.: WO99/54254
PCT Pub. Date: Oct. 28, 1999

(30) Foreign Application Priority Data

Apr. 21, 1998 (DE) .......................................... 198 17 794

(51) Int. Cl.⁷ ....................... C01B 15/01; C01B 15/013; C11D 9/04
(52) U.S. Cl. ........................................ 423/584; 510/175
(58) Field of Search ................ 510/372, 175; 423/584

(56) References Cited

U.S. PATENT DOCUMENTS

| | | |
|---|---|---|
| 3,152,052 A | 10/1964 | Jenney et al. |
| 4,471,014 A | 9/1984 | Den Hartog et al. |
| 4,731,229 A | 3/1988 | Sperandio |
| 4,977,746 A | 12/1990 | Grenier et al. |
| 5,112,702 A | 5/1992 | Berzins et al. |
| 5,275,790 A | 1/1994 | Buchholz et al. |
| 5,296,104 A | 3/1994 | Signorini et al. |
| 5,342,602 A | 8/1994 | Zimmer et al. |
| 5,395,522 A | 3/1995 | Melanson et al. |
| 5,456,898 A | 10/1995 | Shimokawa et al. |
| 5,528,906 A | 6/1996 | Naumovitz et al. |
| 5,558,844 A | 9/1996 | Succi et al. |
| 5,682,763 A | 11/1997 | Agrawal et al. |
| 5,705,040 A | 1/1998 | Johnsson et al. |
| 6,054,109 A * | 4/2000 | Saito et al. .................. 423/584 |

FOREIGN PATENT DOCUMENTS

| | | |
|---|---|---|
| EP | 068 862 | 9/1984 |
| EP | 201 614 | 3/1988 |
| EP | 448 884 | 1/1994 |
| EP | 0 529 722 | 3/1994 |
| EP | 0 727 388 | 1/1998 |
| JP | 09 100 106 | 4/1997 |
| JP | 09 278 416 | 10/1997 |
| JP | 09 278 417 | 10/1997 |
| WO | WO 96/39237 | 12/1996 |

* cited by examiner

*Primary Examiner*—Yogendra N. Gupta
*Assistant Examiner*—John M. Petruncio
(74) *Attorney, Agent, or Firm*—Oblon, Spivak, McClelland, Maier & Neustadt, P.C.

(57) ABSTRACT

Disclosed are a highly pure aqueous hydrogen peroxide solution for use in the electronics industry and a process for the preparation of such solutions, which are essentially free from organics, which comprises catalytically converting hydrogen and oxygen, electrochemically reducing oxygen or electrolyzing an acidic ammonium sulfate solution, in each case in water and with the exclusion of organic compounds and materials which release such compounds.

23 Claims, No Drawings

HIGHLY PURE AQUEOUS HYDROGEN PEROXIDE SOLUTIONS, METHOD FOR PRODUCING SAME AND THEIR USE

The present invention relates to highly pure aqueous hydrogen peroxide solutions, which are in particular essentially free from organics, a process for the preparation of such solutions and their use.

Hydrogen peroxide is widely used in many industrial sectors, for example in chemical synthesis, paper and pulp bleaching, wastewater treatment and as a constituent of chemical polishing fluids. A large part of the hydrogen peroxide is currently prepared by the anthraquinone process. In this process, an anthraquinone derivative, such as a 2-alkylanthraquinone, is reduced to the corresponding alkylanthrahydroquinone in a water-immiscible organic solvent mixture over a hydrogenation catalyst. Subsequent oxidation of this hydroquinone solution with air or oxygen and recovery of the starting 2-alkylanthraquinone yields hydrogen peroxide which is usually extracted with water to form a crude aqueous hydrogen peroxide solution. This crude solution contains numerous inorganic impurities, such as silicon compounds and metals, e.g. Al, Fe, Cr, and Ni, which generally originate from the material of the reactors and synthesis equipment used. Furthermore, the crude solution also contains numerous organic impurities, such as anthraquinone, residual organic solvent and the degradation products of these substances. It is necessary to subject the aqueous hydrogen peroxide solutions to various purifying and/or concentrating steps, depending on their intended use. Examples of known purification processes are distillation, membrane filtration, adsorption on resins and the use of ion exchange resins, which may be employed individually or in combination. The solutions purified in this way may then be concentrated by evaporation and rectification to give a hydrogen peroxide content of about 10–70% by weight of hydrogen peroxide. The quality of the hydrogen peroxide solutions obtained in this way is sufficient for many industrial applications which are not very demanding in terms of removal of inorganic and/or organic impurities, for example for use in wastewater treatment and paper and pulp bleaching.

Owing to the continuing miniaturization of electronic components, it is necessary to provide more and more powerful microchips having higher and higher integration levels. These chips can only be produced from highly pure silicon wafers which generally contain impurities in an amount of 1 ppb or less and sometimes far less than 1 ppb. The production of such electronic components involves process steps, such as wet processing, in which the semiconductors are treated with various cleaning chemicals. This often involves the use of hydrogen peroxide solutions.

A substantial problem in the production of these large-scale-integrated circuits is that the semiconductor surfaces may be contaminated by inorganic or organic compounds present in the cleaning chemicals. All solutions contacting semiconductor elements are therefore required to be extremely pure and should, for example, have a very low ionic impurities content. Said solutions should preferably have a total metal content of 300 ppt or less and, for some metal species, sometimes less than 10 ppt. It is also necessary to avoid contamination by anions, since some anions form complexes with metal ions and may thus interfere with the intentional doping of the semiconductor.

Another substantial problem is that the semiconductor surfaces may be contaminated by organic compounds which may have deleterious effects on subsequent processing steps, such as etching. Therefore, aqueous hydrogen peroxide solutions which are essentially free from organics are much needed.

Processes for the removal of inorganic impurities from hydrogen peroxide solutions are known. WO-A 96/39237 discloses a process for the preparation of ultrapure, aqueous hydrogen peroxide for the production of semiconductors. An anion exchange resin and a cation exchange resin are used to purify an about 30% strength aqueous hydrogen peroxide solution by removal of the cations and anions contained therein. This process has the disadvantage that the resulting hydrogen peroxide solutions may still contain organic impurities in an amount of up to 20 ppm.

The organics contained in the hydrogen peroxide solutions is usually referred to as toc (total organic carbon) and is indicated in units of ppm, i.e. parts of impurity in $10^6$ parts of substance, or ppb ($10^9$) etc. However, the removal of organic impurities is still not satisfactory. For example, hydrogen peroxide obtained by the anthraquinone process cannot be purified by distillation only since it contains volatile or steam-volatile organics. In the case of such a distillate, the hydrogen peroxide solution may still contain organics in an amount of up to 150 mg/l.

U.S. Pat. No. 5,456,898 describes a method for enrichment and purification of a crude aqueous hydrogen peroxide solution obtained by the anthraquinone process. This process comprises adsorbing organic impurities on a synthetic adsorber resin and subsequently concentrating the resulting solution by partial condensation and subsequent fractionated distillation. An aqueous hydrogen peroxide solution is obtained which contains organic impurities in an amount not exceeding 50 ppm.

U.S. Pat. No. 4,999,179 discloses a method for purifying an aqueous hydrogen peroxide solution by removal of metal cations, anions and organic impurities using a combination of a cation exchanger, an anion exchanger and a further halogen-containing porous resin, e.g. a bromine-containing styrene/divinylbenzene copolymer. It is possible to purify hydrogen peroxide solutions which have been produced according to the anthraquinone process. The resulting purified solutions generally have a toc content of 5 ppm or less.

U.S. Pat. No. 5,342,602 likewise discloses a process for reducing the amount of organic impurities in aqueous hydrogen peroxide solutions which have been produced according to the anthraquinone process. In this process, the organic impurities are adsorbed on dealuminized H-Y zeolites or H mordenites. These adsorption agents can be regenerated by calcining at up to 1000° C. According to the examples, toc was reduced to as little as 44 ppm.

All adsorptive methods for removing organic impurities have the disadvantage that they are very complicated. For example, it is generally necessary to subject the adsorber medium to a complicated pretreatment procedure and to regenerate it at a later stage. Furthermore, adsorption processes are demanding from a safety point of view since hydrogen peroxide tends to decompose exothermally.

JP-A-09 100 106 discloses a process for removing organic impurities from hydrogen peroxide solutions without any adsorption step. This process comprises bubbling air or an inert gas through a crude hydrogen peroxide solution to reduce toc from 34.2 mg/l to 10.4 mg/l. A similar process is disclosed in JP-A-09 278 416. JP-A-09 075 605 discloses a process for removing organic impurities from hydrogen peroxide solutions by fractional crystallizations. This energy-intensive and technically very complicated process makes it possible to reduce toc from 64 to 2.7 ppm. A similar process is disclosed in JP-A-09 278 417.

U.S. Pat. No. 5,112,702 discloses a process for making hydrogen peroxide by electrochemical reduction of oxygen. U.S. Pat. No. 5,496,532 discloses a process for producing hydrogen peroxide by catalytic conversion of hydrogen and oxygen in the presence of a catalyst which comprises a platinum group metal. It is also known to prepare hydrogen peroxide by electrolysis of ammonium peroxodisulfate.

None of these processes yields aqueous hydrogen peroxide which fulfills the current purity requirements of the electronics industry, in particular the requirements of excluding, as substantially as possible, inorganic and organic substances. The prior art hydrogen peroxide solutions therefore produce too many rejects in the treatment of electronic component substrates.

It is an object of the present invention to provide highly pure aqueous hydrogen peroxide solutions for treating electronic components and a simple process which is suitable for the industrial scale preparation of such solutions which are substantially free from organics. The process should not include any purifying steps to remove organic compounds subsequent to synthesis.

We have found that this object is achieved by a highly pure aqueous hydrogen peroxide solution containing 100 ppb or less of total organic carbon (toc) and a process which comprises catalytically converting hydrogen and oxygen, electrochemically reducing oxygen or electrolyzing an acidic ammonium sulfate solution, in each case in an aqueous medium and with the exclusion of organic compounds and materials which release such compounds.

The process of the present invention yields aqueous hydrogen peroxide solutions having a total organics content of 100 ppb or less, preferably 10 ppb or less, in particular 1 ppb or less. The hydrogen peroxide concentration of the solutions is generally in the range from about 2 to 80% by weight, preferably from 3 to 75% by weight.

The process for the preparation of a highly pure aqueous hydrogen peroxide solution according to the invention comprises the following steps:

I) provision of highly pure water as reaction medium, highly pure reagents, such as hydrogen, oxygen or ammonium sulfate, highly pure catalyst and very clean equipment, II) preparation of an aqueous hydrogen peroxide solution by catalytically converting hydrogen and oxygen, electrochemically reducing oxygen or electrolyzing an acidic ammonium sulfate solution, in each case in water and with the exclusion of organic compounds and materials which release such compounds, III) removal of inorganic impurities, if required, IV) concentration of the hydrogen peroxide solution, if required.

If desired, the process steps III) and IV) may be carried out one or more times, in any sequence, always carefully excluding organics. Depending on the field of application and the required quality profile of the hydrogen peroxide solution, process step III) may be dispensed with if the presence of any remaining inorganic impurities in the hydrogen peroxide solution is tolerable with respect to its further use. Furthermore, process step IV) may be dispensed with if the hydrogen peroxide solution obtained in process step II) is already sufficiently concentrated for the intended use.

Examples of process step II) include the electrolysis of acidic ammonium sulfate solutions, electric discharge processes as described in U.S. Pat. No. 5,378,436, and preferably direct synthesis processes for the preparation of hydrogen peroxide from hydrogen and oxygen. Suitable synthesis processes include the process for electrochemically reducing oxygen in an electrolysis or fuel cell as described in U.S. Pat. No. 5,112,702, and other direct synthesis processes based on the conversion of hydrogen and oxygen in the presence of transition metal catalysts which are described, for example, in U.S. Pat. No. 5,496,532. The abovementioned publications including suitable processes for the preparation of aqueous hydrogen peroxide solutions are fully incorporated herein by reference.

The water used for the hydrogen peroxide synthesis is essentially free from organic constituents. Water containing no organic impurities may be prepared by conventional processes known to those skilled in the art. U.S. Pat. No. 5,395,522 discloses an apparatus for removal of organic materials from water which is initially subjected to a photocatalytic oxidation and/or ionization and then passes through ion exchange columns for removal of carbondioxide, dissolved acids and ionized organics. Water obtained by combination of appropriate adsorption, filtration, exchange and irradiation processes has a toc content of $\leq$ 100 ppb, preferably $\leq$ 10 ppb, in particular $\leq$ 1 ppb, and a resistivity of more than 18 M$\Omega$cm, and this water is used.

The hydrogen and oxygen used are essentially free from organic impurities. This also applies to inert gases which may be used as diluting gases, e.g. nitrogen. Processes for the purification of these gases are the conventional processes known to those skilled in the art as described, for example, in U.S. Pat. No. 5,558,844, U.S. Pat. No. 4,977,746, U.S. Pat. No. 5,528,906 and U.S. Pat. No. 5,682,763, all of which are fully incorporated herein by reference.

The reaction gas, which, in addition to hydrogen and oxygen, may also contain inert gases such as nitrogen or noble gases, usually has a molar $O_2:H_2$ ratio in the range from about 2:1 to 1000:1. Particular preference is given to a molar ratio in the range from about 5:1 to 100:1. The oxygen used in the reaction gas may also be added to the reaction gas in the form of air. In this case, the air used is of a grade which is essentially free from organics.

The reaction can be carried out both at atmospheric pressure and at superatmospheric pressures of up to 300 bar. The pressure is preferably at least 2 bar, e.g. from 10 to 100 bar, in particular from 10 to 80 bar. The reaction temperature may range from 0 to 60° C., preference being given to operating in the range from 0 to 50° C.

The noble metal catalysts used in the direct synthesis process essentially do not release any organic impurities into the aqueous reaction medium during the preparation of the hydrogen peroxide. If organic compounds were used in the preparation of the catalysts, e.g. as reducing agent or to degrease the surface of the support, these are removed prior to use in the process of the invention to such an extent that virtually no organics are released into the reaction medium. The same applies to the catalyst supports and equipment used. Preference is given to using inorganic or metallic supports as described, for example, in the abovementioned publications. Suitable supported noble metal catalysts are known to those skilled in the art. The catalyst systems consisting of support and active components/promoters are preferably freed from residual organic constituents by subsequent thermal treatment (calcination). If shaped catalyst bodies are to be used in the process of the invention, they can simultaneously be conditioned during the thermal treatment. The thermal aftertreatment may be carried out in an oxidizing inert or reducing atmosphere. The removal of organic constituents by calcining is preferably carried out in an oxidizing atmosphere.

If the support material used is carbon, preliminary tests known to those skilled in the art are performed to ensure that virtually no organic constituents are released into the reaction medium under synthesis conditions.

The direct synthesis is preferably carried out in the presence of a noble metal catalyst comprising at least one platinum group metal, i.e. Ru, Rh, Pd, Os, Ir, Pt or gold. Preference is given to using Pd and Pt. The conversion of hydrogen and oxygen is in particular carried out over shaped catalyst bodies comprising palladium as active component.

Shaped catalyst bodies are catalysts in which the catalytically active component is on the surface of specifically shaped supports. Such supports can be customary packing elements, such as Raschig rings, saddle bodies, Pall® rings, wire spirals or wire-mesh rings, which are composed of various materials suitable for coating with the active component. The packing elements provided with the catalytically active component are introduced into the hydrogen peroxide synthesis reactor in the form of a loose bed. Preferred shaped bodies have channels with hydraulic radii (as defined in Section LE1 of VDI-Wärmeatlas) in the range from 1 to 10 mm.

Preference is given to using shaped catalyst bodies which are installed in the reactor in the form of ranged packings and which have a large surface area for their volume, due to a multiplicity of throughflow channels. Such shaped bodies are referred to as catalyst monoliths hereinafter. Suitable reactors are described, for example, in EP-A 068 862, EP-A 201 614 and der EP-A 448 884.

The catalyst monoliths are usually made of woven fabrics, knitted fabrics, foils, expanded metals and/or sheet metals, in particular of multiple layers of corrugated, bent and/or flat woven fabrics, which are arranged in such a way that adjacent layers form more or less closed channels.

The catalyst supports are coated with the catalytically active component by conventional methods (see below). Monolithic supports are usually coated prior to further processing to give the catalyst monolith. However, it is also possible to coat the preshaped support.

The catalytically active component can contain further metals, preferably noble metals, in particular platinum, rhodium, iridium, copper, silver and/or gold, as promoters in addition to the main palladium component. The palladium/promoter metal ratio is preferably in the range from 100:1 to 1:10, in particular in the range from 10:1 to 1:1. The palladium and the promoter metals, if present, are usually present in an amount of $5 \times 10^{-4}$ to 1% by weight, in particular $10^{-3}$ to 0.15% by weight, based on the total catalyst mass (support+active component).

Stabilizers, preferably mineral acids, for example sulfuric acid, phosphoric acid, hydrochloric acid, hydrobromic acid and mixtures thereof may be added to the reaction medium to inhibit hydrogen peroxide decomposition by the synthesis catalyst. In this case, the acid concentration in the reaction medium of the hydrogen peroxide synthesis is usually at least $10^{-4}$ mol/l, preferably from $10^{-3}$ to $10^{-1}$ mol/l. Furthermore, traces of bromide or chloride may be added to the reaction medium in concentrations of 1–1000 ppm, preferably 5–300 ppm. According to the process of the invention, these stabilizers are employed in ultrapure grade, virtually free from organics.

Suitable reactors for the preparation of hydrogen peroxide are the conventional pressure reactors which are known to those skilled in the art and which have been described, for example, in the abovementioned publications concerning the preparation of hydrogen peroxide, such as stirred reactors, tubular reactors and recirculation reactors. The use of parts which are capable of releasing organics into the reaction medium is avoided. In particular, the use of seals and/or lubricants made of unstable organic materials is avoided. Suitable materials for reactors to be used for the synthesis process of the invention are preferably corrosion-resistant steels, such as stainless steels having the material numbers 1.4571, 1.4439, 1.4539, 1.4462. Useful materials are in general relatively high-alloy, acid-resistant high-grade steel and plastics from which virtually no organics are released into the reaction medium any more. Examples of these plastics include perfluoroalkoxy polymers, polyvinylidene fluorides, polytetrafluoroethylenes and possibly polypropylenes.

The synthesis apparatus is generally carefully rinsed with high purity water prior to use to remove any residual organic impurities.

The process described above makes it possible to prepare hydrogen peroxide solutions having hydrogen peroxide concentrations in the range from about 2 to 25% by weight. If desired, these solutions may be further concentrated as described below.

Depending on the desired field of application of the aqueous hydrogen peroxide solution, the preparation may be followed, if desired, by at least one purification step to remove any inorganic impurities remaining in the aqueous hydrogen peroxide solution and/or concentration step. All of the equipment and all of the reagents are pretreated to remove organics, for example by rinsing with high purity water until the desired toc is achieved.

Since the electronics industry generally requires solutions having a concentration in the range from about 10 to 50% by weight, preferably from 20 to 40% by weight, in particular from 30 to 35% by weight, it is generally necessary to perform both an inorganic impurities removal step and a concentration step.

According to a suitable process variant, an aqueous hydrogen peroxide solution which is essentially free from organics and has a concentration in the range from 2 to 20% by weight and possibly is also contains inorganic impurities is distilled to give a concentration of 20–70% by weight. The distillation can be carried out continuously or batchwise, nonvolatile inorganic impurities, if present, being retained in the bottoms and removed while water and hydrogen peroxide evaporate. Any remaining volatile inorganic impurities may be concentrated and removed by separating off a preliminary fraction which essentially comprises water and any remaining inorganic impurities. It is also possible to carry out a second, separate distillation step. This second distillation step may be performed in distillation columns having a sufficient number of trays, for example up to 30 trays, or in evaporators.

According to a second preferred process variant, the aqueous hydrogen peroxide solution which is essentially free from organics, is worked up continuously. In this variant, the hydrogen peroxide solution is continuously introduced into an evaporator, generally under reduced pressure. The vapor obtained contains water and hydrogen peroxide and also volatile inorganic compounds, if present. These include, for example, hydrogen halides which may be used for stabilization purposes in the preparation of hydrogen peroxide solutions. Any inorganic compounds which are nonvolatile under the process conditions are retained in the bottoms. The resulting vapor is subjected to a partial condensation to give, on the one hand, a condensate having a higher hydrogen peroxide concentration and, on the other, a vapor having a lower concentration. The condensation temperature is generally selected such that a 10 to 35% strength by weight solution of hydrogen peroxide is obtained. Partial condensation processes for the workup of hydrogen peroxide which contains remaining organic impurities, for example originating from the anthraquinone process, are known. They are described, for example, in EP-A-0 727 388, which is incorporated herein by reference. Surprisingly, it has now been found that these processes are also suitable for the separation of inorganic impurities.

According to a third, again continuous process variant, a continuous partial evaporation is carried out to remove inorganic impurities and to concentrate the solution. The continuous partial evaporation comprises, as a first process step, initially evaporating mainly water and relatively volatile inorganic impurities to increase the concentration of the remaining hydrogen peroxide solution. This solution is continuously introduced into a second evaporator stage where the hydrogen peroxide solution is evaporated in the desired final concentration and subsequently condensed, leaving behind in the condensation bottoms a residue which contains the nonvolatile inorganic impurities which have not been removed in the first process stage, such as sulfuric acid or inorganic salts.

If relatively high hydrogen peroxide concentrations in the range from about 20% by weight to more than 70% by weight are desired, these may preferably be obtained by introducing the vapor from the first stage of the second preferred process variant directly into a rectification column. Said rectification column generally has 30 trays or less, preferably 10 trays or less. The bottoms product contains the concentrated hydrogen peroxide solution, whereas the water which has been removed and which preferably has a hydrogen peroxide concentration of less than 1% by weight is withdrawn at the top of the column. The rectification is generally carried out at from about 20 to 100 mbar. Processes for the workup of hydrogen peroxide by evaporation and subsequent rectification were known to date for the removal of organic impurities, for example from the anthraquinone process. Suitable processes are described, for example, in EP-A-0 529 722 and U.S. Pat. No. 3,152,052. Surprisingly, it has now been found that these processes are also suitable for the removal of inorganic impurities. The processes described above are incorporated herein by reference.

When hydrogen peroxide solutions obtained by the abovementioned process variants contain more than 100 ppm of hydrogen halides (HX), ion exchange processes to remove these inorganic impurities are generally costly because of the necessary regeneration of the ion exchanger.

Surprisingly, it has now been found that hydrogen halides can be removed from a water/hydrogen peroxide vapor by washing with an inorganic base when the hydrogen peroxide is worked up by partial evaporation as described above in the third process variant. Suitable bases are alkaline earth metal or alkali metal hydroxides, e.g. NaOH, KOH, Ca(OH)$_2$. Volatile bases are not suitable. The water/hydrogen peroxide vapor is passed through an aqueous solution of these bases, with hydrogen peroxide losses generally being 5% by weight or less, preferably 1% by weight or less, based on the distillation feed. The hydrogen peroxide solutions obtained after washing with base generally have a hydrogen halide concentration of < 1 ppm. If the pH in the wash cycle is 7 or higher, hydrogen halide concentrations of less than 5 ppb are generally achieved.

The present invention further provides the use of the novel hydrogen peroxide solutions containing 100 ppb or less of total organics in electronics industry, for treating electronic component substrates, in particular for treating semiconductor components, but also in the medical field.

Semiconductor components are usually treated, for example in processes for the purification of semiconductor substrates, with cleaning solutions comprising $H_2SO_4/H_2O_2$, $NH_4OH/H_2O_2$ or $NH_4OH/H_2O_2/H_2O$ to remove organics and with cleaning solutions comprising $HCl/H_2O_2/H_2O$ to remove metallic impurities and with buffered hydrogen fluoride or diluted hydrogen fluoride solutions to remove oxide films. The main treatment method is dipping, where the semiconductor substrate is immersed into the cleaning solution.

In the preparation of digital memory modules, such as 4M DRAMs, or other electronic components, such as MOS capacitors, p-n diodes, etc., the properties of the component may be adversely affected by microparticles of 100 nm or less or by contamination with organics and metal ions. The microparticles or organic impurities are deposited on the semiconductor substrate and may cause, for example, pattern defects during lithography or an abnormal thickness of the oxide film during oxygen diffusion, or else generally lead to large variations in diffusion. The effect of organic impurities on the removal of metallic compounds is particularly serious. Small amounts of cations may remain on the substrate due to the organic impurities from the hydrogen peroxide and thus reduce the recombination lifetime of the semiconductor.

If, however, these electronic component substrates are treated with inventive highly pure hydrogen peroxide containing 100 ppb or less, preferably 10 ppb or less, of toc, the proportion of rejects can be reduced significantly. If a highly pure hydrogen peroxide is used, for example, for the preparation of MOS capacitors and p-n diodes, the yield is increased to 91% or more, whereas in the case of a conventional process using hydrogen peroxide having a higher toc content, the yield for MOS capacitors is only about 70–75% and for p-n diodes about 80%. The use of the hydrogen peroxide according to the invention therefore makes it possible to achieve unexpectedly high quality and productivity in the production of semiconductor components.

The examples which follow illustrate the invention.

EXAMPLES

Cations were analyzed by ICP-MS (inductive coupling mass spectrometry), anions were analyzed by ion chromatography. Unless otherwise indicated, all chemicals used were of analytical grade.

Example 1

A corrugated net and a smooth net of V4A metal fabric (1.4571) were placed on top of each other and rolled up to give a cylindrical monolith 5 cm high and 5 cm in external diameter. The ends of the net were fixed by some weld points.

The monolith was degreased by treating with acetone and subsequent rinsing with ultrapure water and then dried. The monolith was then treated with a solution of 25% by weight of concentrated highly pure hydrochloric acid and 75% by weight of ultrapure water at 60° C. for 5 min, then removed from the acid bath and rinsed several times with ultrapure water to remove residual acid. The degreased and dried monolith was placed in 200 ml of ultrapure water. A mixture of 10.8 g of an $Na_2PdCl_4$ solution (1% by weight of Pd) and 1.08 ml of an $H_2PtCl_4$ solution (1% by weight of Pt) was added and then 5.66 g of a 1% strength aqueous solution of sodium hypophosphite was quickly added dropwise. 30 min after the addition was complete, the solution was heated to 70° C. for 20 min. The solution was cooled down and the monolith was washed with ultrapure water and dried at 60° C. under reduced pressure (10 mbar).

Example 2

A Pd/Pt-coated V4A net as prepared in Example 1 was fitted into a 270 ml autoclave equipped with stirrer, thermostating and pressure regulation at 50 bar. After subtraction of the volumes of stirrer, catalyst and other internals, an effective reactor volume of 208 ml was available. Highly pure water was admixed with sulfuric acid, phosphoric acid and hydrobromic acid to produce a reaction medium containing 4000 ppm of sulfate, 1000 ppm of phosphate and 120 ppm of bromide. This solution was analyzed for its organics content (toc content) and contained < 10 ppb of toc. A stream of 60.0 g/h of this reaction medium, 291.6 l/h of oxygen and 32.4 l/h of hydrogen (gases referring to standard temperature and pressure) was then introduced at the bottom of the reactor. The product/gas mixture was continuously discharged at the top of the reactor. At 22° C. and 1500 rpm, the conversion based on hydrogen was 15.4% and the selectivity based on hydrogen was 73%. The concentration of the resulting hydrogen peroxide solution was 8.9% by weight and the space-time yield, based on the cylindrical volume enclosed by the catalyst monolith, was 60 g of hydrogen peroxide $l^{-1}h^{-1}$. The hydrogen peroxide effluent contained less than 10 ppb of toc.

Example 3

The hydrogen peroxide solution obtained in Example 2 (62 g/h) was subjected to a continuous evaporation in a very clean falling film evaporator made of polytetrafluoroethylene (diameter: 30 mm, length: 1000 mm) and with liquid recirculation (100 kg/h). virtually complete evaporation was achieved at an evaporator temperature of 80° C. and 100 mbar. A concentrated solution mainly consisting of sulfuric acid, phosphoric acid, hydrogen peroxide, water and metal ions remained in the evaporator bottoms and was continuously withdrawn. The vapor consisting of water, hydrogen peroxide and hydrogen bromide was washed with diluted highly pure aqueous sodium hydroxide (pH 8) and then subjected to a partial condensation at 33 to 36° C. in a very clean condenser lined with polytetrafluoroethylene. 26.6 g/h of a 20.5% strength by weight hydrogen peroxide solution were obtained as condensate. This hydrogen peroxide solution was analyzed for its organics and inorganics content. The remaining vapor was subjected to a total condensation at 50C. Analysis results are listed in Table 1.

TABLE 1

| | $H_2O_2$ [% by wt.] | toc content [mg/kg] | Σ cations [mg/kg] | Sulfate [mg/kg] | Phosphate [mg/kg] | Bromide [mg/kg] |
|---|---|---|---|---|---|---|
| Distillation and wash | 20.5 | <0.01 | <0.0001 | <0.01 | <0.01 | <0.01 |

Example 4

A corrugated net and a smooth net of metal fabric (1.4539) were placed on top of each other and rolled up to give a cylindrical monolith 5 cm high and 5 cm in external diameter. The ends of the net were fixed by some weld points.

The monolith was degreased by treating with ultrapure acetone and subsequent rinsing with ultrapure water and then dried. The monolith was then treated in a solution of concentrated highly pure hydrochloric acid at 60° C. for 2 h, then removed from the acid bath and rinsed several times with ultrapure water to remove residual acid. The dried monolith was placed in 350 ml of ultrapure water. A mixture of 8.35 g of a $PdCl_2$ solution (1% by weight of Pd) and 0.83 g of a $H_2PtCl_4$ solution (1% by weight of Pt) was added and then 4.33 g of a 1% strength aqueous solution of sodium hypophosphite were quickly added dropwise. 90 min after the addition was complete, the solution was heated to 60° C. for 30 min. The solution was cooled down and the monolith was washed with ultrapure water. The net roll was then hydrogenated with hydrogen at 50° C. and 50 bar for 90 min.

Example 5

A Pd/Pt-coated catalyst as prepared in Example 4 was placed into the 270 ml autoclave of Example 2. The effective reactor volume was 208 ml, as in Example 2. The highly pure reaction medium of Example 2 was used. The medium contained less than 10 ppb of toc. A stream of 57.0 g/h of this reaction medium, 291.6 l/h of oxygen and 32.4 1l/h of hydrogen (gases referring to standard temperature and pressure) was then introduced at the bottom of the reactor. The product/gas mixture was continuously discharged at the top of the reactor. At 20° C. and 1500 rpm, the conversion based on hydrogen was 17% and the selectivity based on hydrogen was 84%. The concentration of the resulting hydrogen peroxide solution was 11.1% by weight and the space-time yield, based on the cylindrical volume enclosed by the catalyst monolith, was 78 g of hydrogen peroxide $l^{-1}h^{-1}$. The hydrogen peroxide effluent contained less than 10 ppb of toc.

Example 6

The hydrogen peroxide solution obtained in Example 5 (62 g/h) was subjected to the continuous evaporation described in Example 3. 28.9 g/h of a 23.5% strength by weight hydrogen peroxide solution were obtained as condensate. This hydrogen peroxide solution was analysed for its organics and inorganics content. The remaining vapor was subjected to a total condensation at 5° C. Analysis results are listed in Table 2.

TABLE 2

| | $H_2O_2$ [% by wt.] | toc content [mg/kg] | Σ cations [mg/kg] | Sulfate [mg/kg] | Phosphate [mg/kg] |
|---|---|---|---|---|---|
| Distillation | 23.5 | <0.01 | <0.0001 | <0.01 | <0.01 |

Example 7

A Pd/Pt-coated catalyst as prepared in Example 4 was placed in the 270 ml autoclave of Example 2. The effective reactor volume was again 208 ml. high purity water was admixed with sulfuric acid, phosphoric acid and hydrochloric acid to produce a reaction medium containing 4000 ppm of sulfate, 1000 ppm of phosphate and 600 ppm of chloride. The medium contained less than 10 ppb of toc. A stream of 264 g/h of this reaction medium, 291.6 l/h of oxygen and 32.4 l/h of hydrogen (gases referring to standard temperature and pressure) was then introduced at the bottom of the reactor. The product/gas mixture was continuously discharged at the top of the reactor. At 21° C. and 1500 rpm, the conversion based on hydrogen was 23% and the selectivity based on hydrogen was 57%. The concentration of the resulting hydrogen peroxide solution was 2.4% by weight and the space-time yield, based on the cylindrical volume enclosed by the catalyst monolith, was 73 g of hydrogen peroxide $l^{-1}h^{-1}$. The hydrogen peroxide effluent contained less than 10 ppb of toc.

Example 8 (comparative)

Cleaning of a semiconductor substrate using prior art hydrogen peroxide having a high toc content.

Semiconductor substrates were coated with photoresit to simulate organic contamination and then subjected to the customary rinsing and cleaning steps (treatment with $H_2SO_4/H_2O_2$ and buffered hydrogen fluoride solution, in each case with ultrapure water rinse phases in between). Hydrogen peroxide of customary semiconductor grade containing 15 ppm of toc was used for the cleaning steps. After the cleaning steps, the semiconductor was assessed by determining the recombination lifetime of the holes. The recombination lifetime was 60 microseconds and was thus significantly reduced compared with a clean reference substrate (recombination lifetime: 100 microseconds).

Example 9

Cleaning of a semiconductor substrate using inventive hydrogen peroxide having a low toc content (< 100 ppb)

Semiconductor substrates contaminated with photoresist were subjected to the customary rinsing and cleaning steps (treatment with $H_2SO_4/H_2O_2$ and buffered hydrogen fluoride solution, in each case with ultrapure water rinse phases in between) as described in Example 8. However, high purity hydrogen peroxide containing 72 ppb of toc was used for the cleaning steps. After the cleaning steps, the semiconductor was again assessed by determining the recombination lifetime of the holes. The recombination lifetime was 100 microseconds, the same as for the clean reference substrate.

Example 10

Cleaning of a semiconductor substrate which had been exposed to metal contamination.

Semiconductor substrates were immersed for 10 min in a cleaning solution of $HF/H_2O_2$ (1% by weight each) which contained either 1 ppm of iron ions or 1 ppm of copper ions, rinsed with ultrapure water for 10 min and dried by centrifugation. high purity hydrogen peroxide containing 72 ppb of toc was used in the cleaning solution. The semiconductor was again assessed by determining the recombination lifetime of the holes and was the same as for a clean reference substrate. This example shows that metallic impurities are not taken up in measurable amounts from cleaning solutions containing high purity hydrogen peroxide according to the present invention.

We claim:

1. An aqueous hydrogen peroxide solution containing 100 ppb or less of total organic carbon (toc).

2. The hydrogen peroxide solution of claim 1 that contains 10 ppb or less total organic carbon.

3. The hydrogen peroxide solution of claim 1 that contains 1 ppb or less total organic carbon.

4. A process for the preparation of an aqueous hydrogen peroxide solution containing 100 ppb or less of total organic carbon (toc) comprising:

synthesizing hydrogen peroxide in an aqueous medium,
wherein the hydrogen peroxide synthesis is performed with reagents, materials and/or equipment that produces a hydrogen peroxide solution with a total organic carbon content of 100 ppb or less, and
wherein said synthesis produces hydrogen peroxide containing 100 ppb or less of total organic carbon (toc) without further purifying steps subsequent to synthesis.

5. The process of claim 4, wherein said synthesis is carried out in an aqueous medium containing 100 ppb or less of organic compounds.

6. The process of claim 4, wherein said synthesis is carried out in an aqueous medium containing 10 ppb or less of organic compounds.

7. The process of claim 4, wherein said synthesis is carried out in an aqueous medium containing 1 ppb or less of organic compounds.

8. The process of claim 4, wherein hydrogen peroxide is synthesized by catalytic conversion of oxygen and hydrogen.

9. The process of claim 8, wherein the hydrogen and oxygen are catalytically converted over a catalyst that comprises a platinum group metal on an inert support.

10. The process of claim 8, wherein the hydrogen and oxygen are catalytically converted over a catalyst that comprises palladium on an inert support.

11. The process of claim 8, wherein the catalyst has been calcined at a temperature ranging from 200 to 900° C. prior to the reaction and/or for regeneration purposes.

12. The process of claim 8, wherein the hydrogen, oxygen, and, if required, at least one inert gas employed in the catalytic conversion, each contain 1 ppb or less of organic compounds.

13. The process of claim 4, wherein hydrogen peroxide is synthesized by electrochemically reducing oxygen.

14. The process of claim 4, wherein hydrogen peroxide is synthesized by electrolyzing an acidic ammonium sulfate solution.

15. The process of claim 4, further comprising concentration of the hydrogen peroxide.

16. The process of claim 4, further comprising the removal of inorganic impurities from the hydrogen peroxide.

17. The process of claim 16, wherein the inorganic impurities are removed from the hydrogen peroxide solution by means of an ion exchanger from which virtually no organics are released under operating conditions.

18. The process of claim 4, wherein the aqueous hydrogen peroxide solution is subjected to a two-stage or multi-stage distillation, a partial condensation or a partial vaporization to remove inorganic impurities and to concentrate said solution at the same time.

19. The process of claim 18, wherein the hydrogen peroxide solution is subjected to a partial vaporization and the resulting water/hydrogen peroxide vapor mixture is washed with a high purity aqueous alkaline solution of a nonvolatile base.

20. An aqueous hydrogen peroxide solution having a total organic carbon content of 100 ppb or less produced by the method of claim 4.

21. The aqueous hydrogen peroxide solution of claim 20 that has a hydrogen peroxide concentration ranging from 20 to 70% by weight.

22. A method for treating an electronic or semiconductor component comprising contacting said component with a solution comprising hydrogen peroxide having a total organic carbon content of 100 ppb or less.

23. The method of claim 22 comprising removing an organic compound from said component.

* * * * *